(12) United States Patent
Olin

(10) Patent No.: US 11,522,362 B2
(45) Date of Patent: Dec. 6, 2022

(54) CONTROL DEVICE FOR HANDLING THE TRANSFER OF ELECTRIC POWER

(71) Applicant: EPSPOT AB, Stockholm (SE)

(72) Inventor: Jan Olin, Stockholm (SE)

(73) Assignee: EPSPOT AB, Stockholm (SE)

( * ) Notice: Subject to any disclaimer, the term of this patent is extended or adjusted under 35 U.S.C. 154(b) by 72 days.

(21) Appl. No.: 17/265,353

(22) PCT Filed: Aug. 9, 2018

(86) PCT No.: PCT/EP2018/071657
§ 371 (c)(1),
(2) Date: Feb. 2, 2021

(87) PCT Pub. No.: WO2020/030274
PCT Pub. Date: Feb. 13, 2020

(65) Prior Publication Data
US 2021/0313800 A1    Oct. 7, 2021

(51) Int. Cl.
*H02H 9/04* (2006.01)
*H02J 13/00* (2006.01)
(Continued)

(52) U.S. Cl.
CPC ....... *H02H 9/042* (2013.01); *G01R 19/16538* (2013.01); *H02H 7/125* (2013.01);
(Continued)

(58) Field of Classification Search
CPC ...... H02H 7/125; H02H 7/1255; H02H 9/042; H02H 9/043; H02H 9/046; H02H 9/04;
(Continued)

(56) References Cited

U.S. PATENT DOCUMENTS

| 7,821,428 B2 | 10/2010 | Leung et al. |
| 8,576,928 B2 | 11/2013 | Allen |

(Continued)

FOREIGN PATENT DOCUMENTS

| DE | 102010030353 A1 | 12/2011 |
| WO | 0110175 A1 | 2/2001 |

OTHER PUBLICATIONS

EPSPOT AB, International Application No. PCT/EP2018/071657, International Search Report, dated Apr. 17, 2019.
(Continued)

*Primary Examiner* — Nguyen Tran
(74) *Attorney, Agent, or Firm* — Moore & Van Allen PLLC; W. Kevin Ransom

(57) ABSTRACT

Electric power is transferred to an electric load as alternating current over at least two incoming and outgoing lines. At least one line circuit manages at least one parameter of the transferred electric power. A central circuit exchanges data and/or commands with the at least one line circuit over a respective galvanically isolated communication interface, such that a reference potential of the central circuit is floating relative to an earth potential of the at least two incoming and outgoing lines. A respective surge protection capacitor is arranged in parallel with each galvanically isolated communication interface. The surge protection capacitors are configured to accumulate a respective fraction of an electric charge resulting from an undesired overvoltage on one of said incoming lines so as to split up the undesired overvoltage into two or more voltages over the galvanically isolated communication interfaces each of which voltage is smaller than the undesired overvoltage.

10 Claims, 3 Drawing Sheets

(51) Int. Cl.
  *G01R 19/165* (2006.01)
  *H02H 7/125* (2006.01)
  *H02J 7/02* (2016.01)
  *H02M 1/32* (2007.01)

(52) U.S. Cl.
  CPC .......... *H02J 7/02* (2013.01); *H02J 13/00022* (2020.01); *H02J 13/00034* (2020.01); *H02M 1/32* (2013.01)

(58) Field of Classification Search
  CPC .................. H02H 9/02; H02J 13/00022; H02J 13/00034; H02J 13/00032
  See application file for complete search history.

(56) References Cited

U.S. PATENT DOCUMENTS

| | | |
|---|---|---|
| 8,818,265 B2 | 8/2014 | Steeneken et al. |
| 2008/0198527 A1 | 8/2008 | Higashi et al. |
| 2011/0057661 A1* | 3/2011 | Samineni ................ H02H 7/16 |
| | | 324/521 |
| 2014/0355164 A1 | 12/2014 | Dangy-Caye |
| 2015/0070950 A1 | 3/2015 | Myhre et al. |
| 2021/0377059 A1* | 12/2021 | Salazar .................. H04L 12/10 |
| 2022/0069571 A1* | 3/2022 | Yau ...................... H02H 1/0007 |

OTHER PUBLICATIONS

EPSPOT AB, International Application No. PCT/EP2018/071657, Written Opinion, dated Apr. 17, 2019.
EPSPOT AB, Indian Patent Application No. 202127009129, Examination Report, dated Aug. 29, 2022.

* cited by examiner

CONTROL DEVICE FOR HANDLING THE TRANSFER OF ELECTRIC POWER

CROSS-REFERENCE TO RELATED APPLICATION

This application is a national stage application (filed under 35 § U.S.C. 371) of PCT/EP2018/071657, filed Aug. 9, 2018 of the same title; the contents of which are hereby incorporated by reference.

TECHNICAL FIELD

The invention relates generally to reliable transfer of electric power from a power source to a load. In particular, the present invention concerns a control device for handling the supply of electric power from a power source to a load in the form of alternating current, via at least two incoming lines and at least two outgoing lines.

BACKGROUND

There are numerous of examples of situations where an incoming line of equipment needs to be protected against undesired overvoltages. One such example is a voltage surge, or spike, i.e. a sudden rise in excessive voltage that damages the electrical equipment of an installation if no countermeasures are taken. Typically, the voltage surge occurs as a spike in both voltage and current, i.e. a voltage spike produces a corresponding increase in current, or vice versa. For sensitive electronics, excessive current can flow if the voltage spike exceeds a material's breakdown voltage, or if the voltage spike causes avalanche breakdown. In semiconductor junctions, excessive electric current may destroy or severely weaken that device. Voltage surges may be created by a rapid buildup or decay of a magnetic field, which induces energy into an associated circuit. However, voltage surges can also have more mundane causes, such as a fault in a transformer or higher-voltage power wires falling onto lower-voltage power wires as the result of an accident or storm damage.

Power increases or decreases, which last multiple cycles, are called swells or sags respectively. An uninterrupted voltage increase may also last even longer, for example in the order of minutes. These overvoltages are usually caused by malfunctions of the electric power distribution system.

The prior art contains various examples of designs for protecting equipment and circuitry from harmful voltages. For instance, WO 01/10175 discloses a lamp driver unit for, in particular, fluorescent lamps. The lamp driver unit includes an inductive and capacitive output stage, which is driven by a microcontroller that controls very precisely the frequency of the signals used or applied to the L/C network. The microcontroller uses a counter and a stable high frequency oscillator to produce a very stable and accurate frequency signal for application to the L/C resonant network, which, in turn, results in closely controlled lamp operating parameters. Advantageously, such precise control of the operating frequency results in, for example, significantly improved lamp life, operating conditions, consistent output intensity, color, and significant flexibility in being able to accommodate changes in lamp drive parameters.

U.S. Pat. No. 8,576,928 describes a communication system having first and second transceivers. The first transceiver has first and second ports coupled to a communication medium, wherein a first differential capacitor couples the first and second ports together. The second transceiver has third and fourth ports each AC coupled to the communication medium, wherein a second differential capacitor couples the third and fourth ports together.

U.S. Pat. No. 7,821,428 reveals an integrated circuit that includes a first microcontroller unit for executing instructions in accordance with a first clock frequency. The microcontroller located on a first die and includes a first processing core for providing a parallel stream of data in accordance with the first clock frequency. A second microcontroller unit executes instructions in accordance with the first clock frequency. The second microcontroller is located on a second die and includes a second processing core for receiving the parallel stream of data in accordance with the first clock frequency. Capacitive isolation circuitry connected with the first microcontroller unit and the second microcontroller unit provides a high voltage isolation link between the first and the second microcontroller units. The capacitive isolation circuitry distributing a first portion of a high voltage isolation signal across a first group of capacitors is associated with the first microcontroller unit and distributes a second portion of the high voltage isolation signal across a second group of capacitors associated with the second microcontroller unit. The capacitive isolation circuitry further transmits data from the parallel data stream between the first microcontroller and the second microcontroller in a serial data stream in accordance with the second clock frequency.

U.S. Pat. No. 8,818,265 shows circuitry for isolation and communication of signals between circuits operating in different voltage domains using capacitive coupling. Capacitive structures are utilized that have increased breakdown voltage in comparison to previous parallel plate implementations. The capacitive isolation is provided by parallel plate capacitive structures, each implemented to have parallel plates of different horizontal sizes. Due to the difference in horizontal size, edges of the parallel plates, where electric fields are the strongest, are laterally offset from the region where the parallel plates overlap. As a result, breakdown voltage between the parallel plates is increased.

Thus, designs are known for protecting circuitry against different kinds of overvoltages. However, there is yet no satisfying solution for protecting digital isolator components from incoming undesired over voltages, where the incoming line in question needs to be galvanically connected to a supervision and/or control circuit.

SUMMARY

One object of the present invention is therefore to offer a reliable and compact solution, which enables galvanic connection of supervision and/or control circuits to a set of power lines, and at the same time, provides efficient surge protection for a central circuit coordinating the supervision and/or control circuits.

According to the invention, this object is achieved by a control device for handling the transfer of electric power from an electric power source to an electric load, where the electric power is supplied in the form of alternating current via at least two incoming lines and is delivered as alternating current via at least two outgoing lines. The control device contains at least one line circuit and a central circuit. The at least one line circuit is configured to manage at least one parameter of the electric power being transferred via a particular one of said at least two outgoing lines. The central circuit is configured to exchange data and/or commands with the at least one line circuit over a respective galvanically isolated communication interface. As a result, a reference potential of the central circuit is rendered floating relative to an earth potential of the at least two incoming and outgoing lines. A respective surge protection capacitor is arranged in parallel with each of the galvanically isolated communication interfaces. The surge protection capacitors are configured to accumulate a respective fraction of an electric charge resulting from an undesired overvoltage on one of the incoming lines, so as to split up the undesired overvoltage into two or more voltages over galvanically isolated communication interfaces, which each is smaller than the undesired overvoltage.

In other words, the undesired overvoltage is spread out over two or more interfaces. This, in turn, means that the barrier requirements can be mitigated and the components can be made physically smaller and less expensive, and still fulfill regulatory requirements regarding insulation ratings.

In one embodiment of the invention, the surge protection capacitors all have the same value. Namely, thereby, the design is equally well protected against undesired overvoltages in any of the incoming lines.

According to another embodiment of the invention, each of the surge protection capacitors is communicatively separated from the respective galvanically isolated communication interface in parallel with which it is arranged. Thereby, the exchange of commands and/or data over the communication interface can be made fully independent from the surge protection capacitors. For example, the communication interface may transfer optical only signals, or inductive only signals.

According to still another embodiment of the invention, one of the line circuits is a charge control circuit configured to manage charging of at least one battery comprised in the load. Thereby, the proposed design can be employed in a charging station to supervise and control refueling of battery-powered vehicles.

Preferably, the charge control circuit is connected to a protected earth voltage line associated with the at least two of the incoming and outgoing lines. Namely, this arrangement enhances the safety for the users operating the charging station.

Further preferably, the central circuit is implemented in accordance with the extra-low voltage directive of the European Union. Consequently, good personnel safety can be guaranteed.

According to a further embodiment of the invention, the central circuit contains a communication interface arranged to exchange data and/or commands with a remote server. This communication interface may be implemented either by PLC technique, or as a wireless communication interface. In any case, the communication interface is configured to exchange the data and/or commands with the remote server. Thus, the control device can conveniently be remote accessed for external control and/or supervision.

According to yet another embodiment of the invention, the control device contains an overvoltage-protection circuit, which is connected between at least one of the incoming lines and a power supply to the central circuit. The overvoltage-protection circuit is configured to protect the central circuit from any overvoltages in the incoming line to which it is connected. Thereby, the central circuit can be power supplied in a convenient manner.

Further advantages, beneficial features and applications of the present invention will be apparent from the following description and the dependent claims.

BRIEF DESCRIPTION OF THE DRAWINGS

The invention is now to be explained more closely by means of preferred embodiments, which are disclosed as examples, and with reference to the attached drawings.

DETAILED DESCRIPTION

Figure 1:
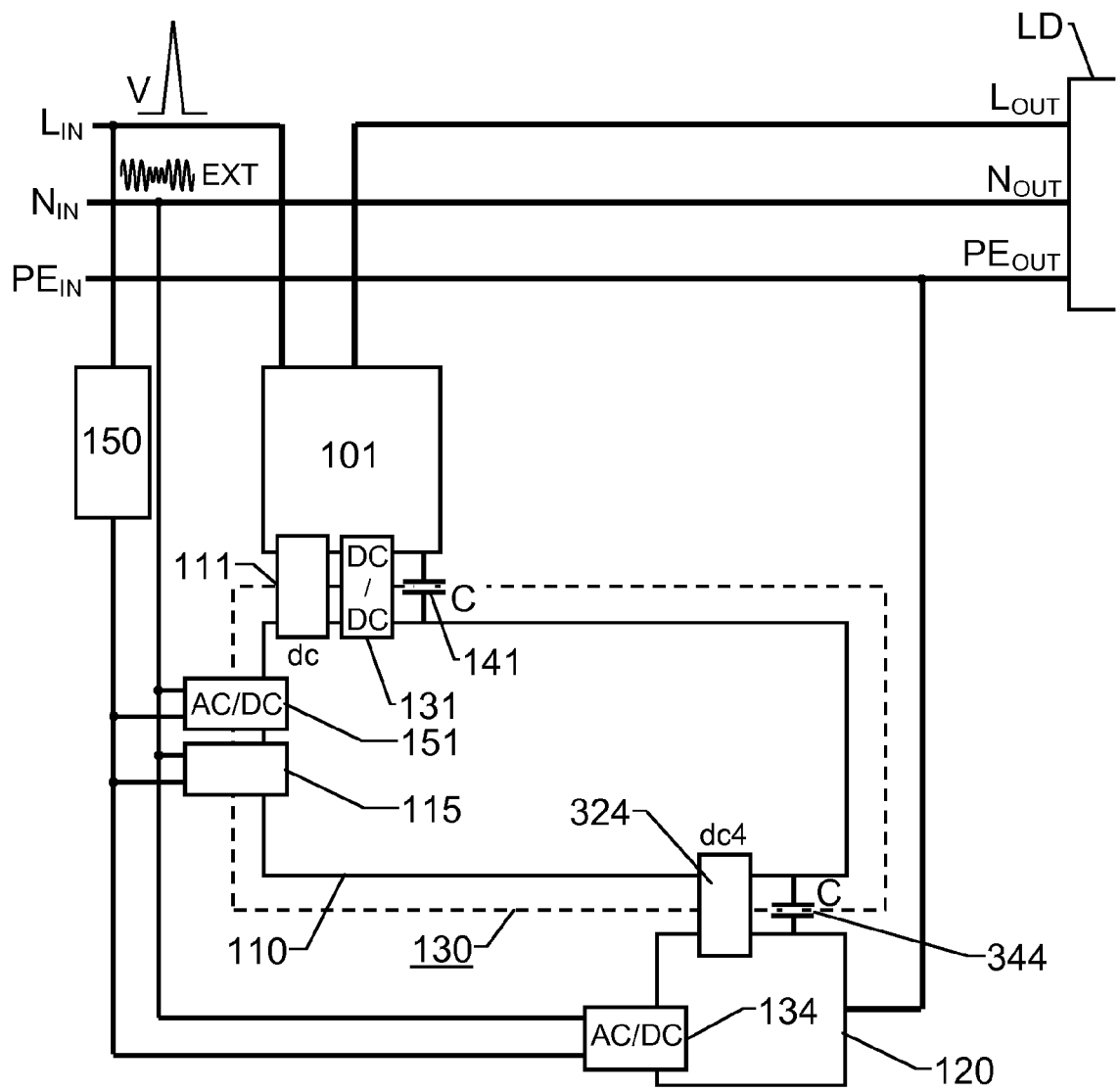
FIG. 1 shows a block diagram over a control device according to a first embodiment of the invention.

FIG. 1 depicts a block diagram over a control device according to a first embodiment of the invention. The control device handles the transfer of electric power from an electric power source, for example a power grid, to an electric load LD.

The electric power is supplied in the form of alternating current, e.g. 230 V at 50 Hz, via two incoming lines $L_{IN}$ and $N_{IN}$ respectively. The electric power is delivered to the load LD via two outgoing lines $L_{OUT}$ and $N_{OUT}$ respectively. Moreover, the incoming lines $L_{IN}$ and $N_{IN}$ are associated with a protected earth voltage line $PE_{IN}$, which is connected to the load LD via a line $PE_{OUT}$ associated with the incoming and outgoing lines $L_{OUT}$ and $N_{OUT}$. The protected earth voltage line $PE_{IN}/PE_{OUT}$ also connected to the control device as will be described below.

The control device contains first and second line circuits 101 and 120 respectively. The first line circuit 101 is configured to manage at least one parameter of the electric power being transferred via a particular one of the outgoing lines $L_{OUT}$ and $N_{OUT}$. For example, this may involve registering a current magnitude and/or measuring an amount of power delivered to the load LD. The management performed by the first line circuit 101 may further involve connecting/disconnecting the load LD to/from the incoming lines $L_{IN}$ and $N_{IN}$, for instance in response to an external input, e.g. in the form of commands EXT as will be described below with reference to FIGS. 3 and 5.

The second line circuit 120 preferably manages at least one parameter different from the at least one parameter handled by the first line circuit 101. For example, if the electric load LD is a battery of an electric vehicle, the second line circuit 120 may implement a charge control circuit for managing the charging process.

A central circuit 110 in the control device is configured to exchange data and/or commands dc and dc4 with the line circuits 101 and 120 over a respective galvanically isolated communication interface 111 and 324. As a result, the central circuit 110 becomes a "floating island" 130 with respect to voltage potentials. This means that there is no voltage reference, such as earth voltage, linking the voltages in the central circuit 110 to any external voltage levels. In other words, a reference potential of the central circuit 110 is floating relative to an earth potential of the incoming and outgoing lines $L_{IN}$, $N_{IN}$ and $L_{OUT}$, $N_{OUT}$ respectively.

A respective surge protection capacitor 141 and 344 is arranged in parallel with each of the galvanically isolated communication interfaces 111 and 324. The purpose of the surge protection capacitors 141 and 344 is to store electric charges in case of an undesired overvoltage occurring in the power lines.

To this aim, each of the surge protection capacitors 141 and 344 is connected to a zero-volt/earth potential of the circuit concerned. I.e. the surge protection capacitor 141 is connected between the earth potential of the first line circuit 101 and the zerovolt potential of the central circuit 110, and the surge protection capacitor 344 is connected between the zero-volt potential of the central circuit 110 and the earth potential of the second line circuit 120.

Specifically, the surge protection capacitors 141 and 344 are configured to accumulate a respective fraction of an electric charge resulting from an undesired overvoltage, such as a spike V, on an incoming line, say $L_{IN}$, so as to split up the undesired overvoltage V into two smaller voltages over the galvanically isolated communication interfaces 111 and 324. Therefore, each surge protection capacitor 141 and 344 must be selected so that it is capable of withstanding the voltage to which it may be exposed. Preferably, the surge protection capacitors 141 and 344 are so-called safety capacitors. Depending on the rating, these capacitors are capable of withstanding 5 kV to 8 kV.

Figure 2:
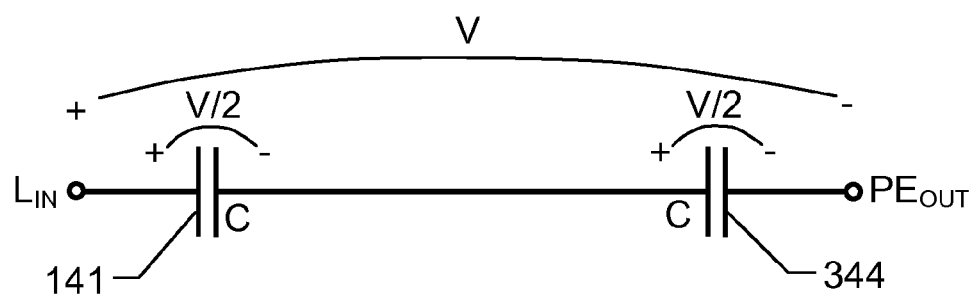
FIG. 2 illustrates schematically how the voltage of an incoming spike is divided between the two surge protection capacitors in the design of FIG. 1.

Referring now to FIG. 2, we see a schematic illustration of how the voltage of the undesired overvoltage V is divided between the two surge protection capacitors 141 and 344. This voltage-split up is the result of the central circuit 110 being a "floating island" 130 as described above. Assuming that both the surge protection capacitors 141 and 344 have the same capacitance value C, preferably a rather high value—for example in the order of nF—half the voltage V/2 of the undesired overvoltage V will placed over each surge protection capacitor 141 and 344 respectively. According to the invention, any other mutual size ratio than 1:1 between the capacitor values is conceivable. For example if the risk of voltage spikes is estimated to be higher on one or more lines and/or if particular interfaces are more/less vulnerable to voltage spikes it may be beneficial to use nonsymmetric capacitor values. However, if the risk of voltage spikes is estimated to be essentially the same on both/all lines, it is advantageous that the surge protection capacitors have identical values.

According to one embodiment of the invention, an overvoltage-protection circuit 150 is connected between one of the incoming lines, here exemplified by $L_{IN}$, and a power supply 151 to the central circuit 110. Specifically, the power supply 151 implements an AC/DC unit configured to provide the central circuit 110 with suitable direct-current power. The overvoltage-protection circuit 150 is configured to protect the power supply 151 from any overvoltages in the incoming line $L_{IN}$.

Figure 3:
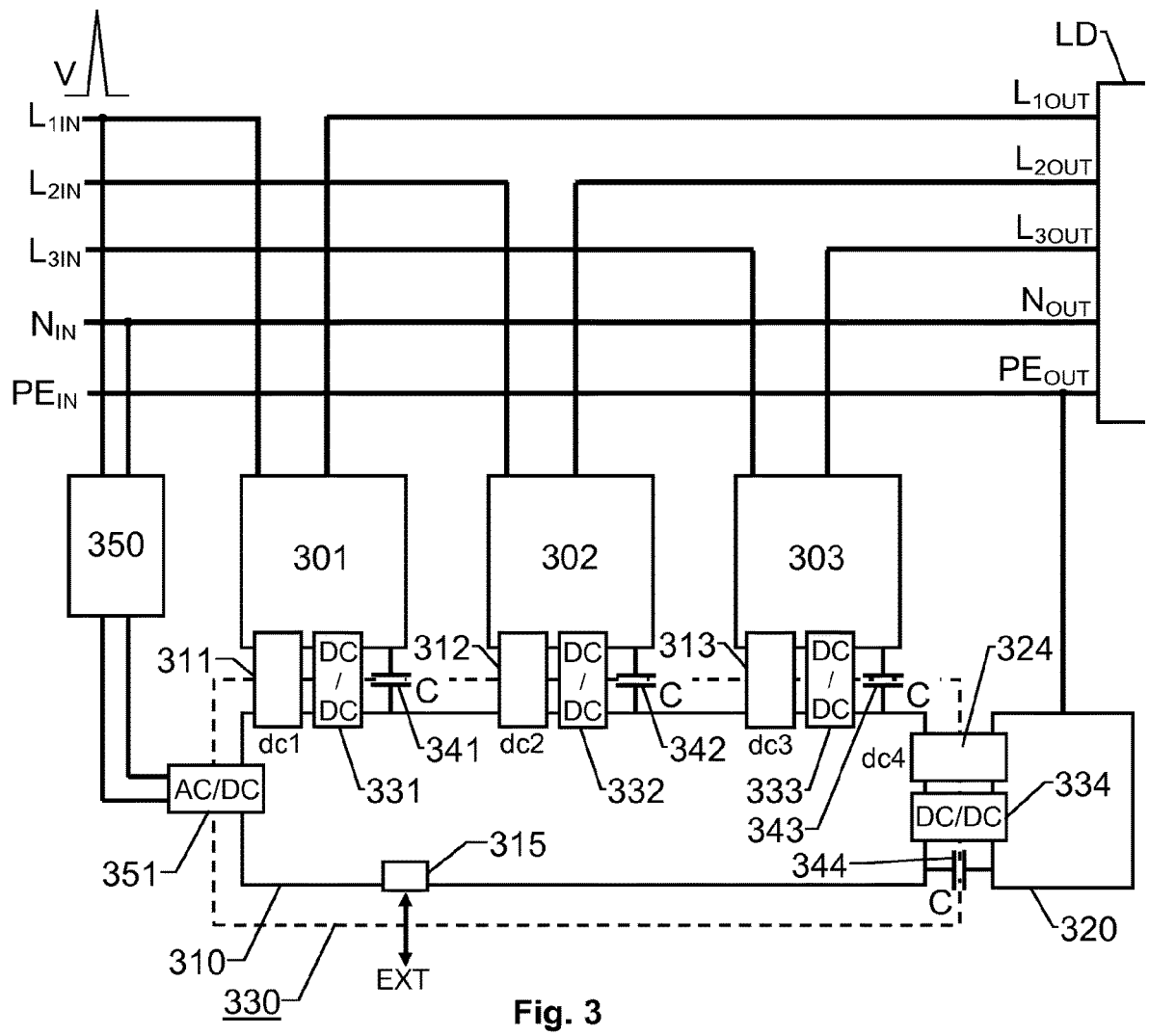
FIG. 3 shows a block diagram over a control device according to a second embodiment of the invention.

FIG. 3 shows a block diagram over a control device according to a second embodiment of the invention. Here, all reference numbers, which also occur in, FIG. 1 designate the same components and entities as those described above with reference to FIG. 1.

In FIG. 3, electric power is transferred from an electric power source the electric load LD via in total five incoming lines $L_{1IN}$, $L_{2IN}$, $L_{3IN}$, $N_{IN}$ and $PE_{IN}$ and five outgoing lines $L_{1OUT}$, $L_{2OUT}$) $L_{3OUT}$ and $PE_{OUT}$. Under error-free conditions, no currents will be fed via the $PE_{IN}/PE_{OUT}$ lines; and if the load is symmetric, no currents will be fed via the $N_{IN}/N_{OUT}$ lines either. Thus, depending on the conditions, the lines $L_{1IN}$, $L_{2IN}$ $L_{3IN}$ and $N_{IN}/N_{OUT}$ are involved in the actual transfer of electric power. Here, the electric power is supplied in the form of alternating current in three separate phases, e.g. at 50 Hz with each 230 V phase voltage to earth, i.e. with 400 V between any two of the phase lines.

The control device contains a central circuit 310 and line circuits 301, 302, 303 and 320. Analogous to the first embodiment shown in FIG. 1, each of the line circuits 301, 302, 303 and 320 is configured to manage at least one parameter of the electric power being transferred via a particular one of the outgoing lines $L_{1OUT}$, $L_{2OUT}$, $L_{3OUT}$ and $PE_{OUT}$ respectively.

The management performed by the line circuits 301, 302 and 303 may relate to one or more first parameters, such as repeatedly registering current values and/or measuring power consumption of the load LD and/or performing switching operations, e.g. connecting and disconnecting the electric load LD to/from the power lines. The line circuit 320, however, may perform a task different from those effected in the line circuits 301, 302 and 303. For example, if the electric load LD is a battery of an electric vehicle, the line circuit 320 may implement a charge control circuit for managing the charging process. In any case, the line circuit 320 is connected to the protected earth voltage line $PE_{IN}/PE_{OUT}$.

The central circuit 310 is configured to exchange data and/or commands dc1, dc2, dc3 and dc4 with the line circuits 301, 302, 303 and 320 over a respective galvanically isolated communication interface 311, 312, 313 and 324. Thus, the central circuit 310 may effect actions with respect to the line circuits 301, 302, 303 and 320, such as switching operations, and/or readout measured parameters, such as current magnitude and/or power consumption. Analogous to the above, the galvanically isolated communication interfaces 311, 312, 313 and 324 render a reference potential of the central circuit 310 floating relative to an earth potential of the at least two incoming and outgoing lines $L_{1IN}$, $L_{2IN}$, $L_{3IN}$, $N_{IN}$ and $PE_{IN}$ and $L_{1OUT}$, $L_{2OUT}$, $L_{3OUT}$ and $PE_{OUT}$ respectively.

Figure 4:
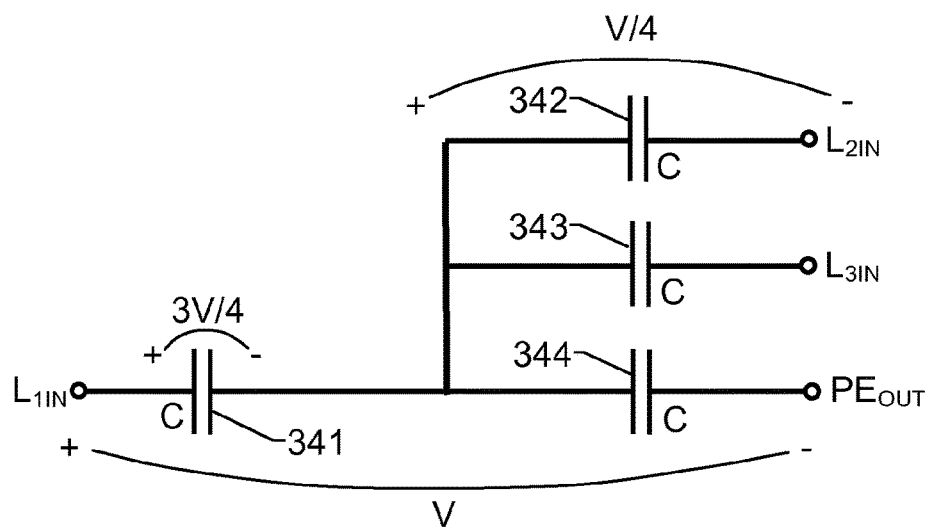
FIG. 4 illustrates schematically how the voltage of an incoming spike is divided between the four surge protection capacitors in the design of FIG. 3.

Furthermore, a respective surge protection capacitor 341, 342, 343 and 344 is arranged in parallel with each galvanically isolated communication interface 311, 312, 313 and 324. The surge protection capacitors 341, 342, 343 and 344 are configured to accumulate a respective fraction of an electric charge resulting from an undesired overvoltage V on one of the incoming lines $L_{1IN}$, $L_{2IN}$, $L_{3IN}$ or $PE_{IN}$, so as to split up the undesired overvoltage V. Here, however, provided that all the surge protection capacitors 341, 342, 343 and 344 have the same value C, the voltage is divided into the fractions 3V/4 and V/4 respectively over the galvanically isolated communication interfaces 311, 312, 313 and 324 and via the associated the surge protection capacitors 341, 342, 343 and 344 respectively as illustrated in FIG. 4. Nevertheless, of course, each voltage fraction is smaller than the undesired overvoltage V. For example, if the undesired overvoltage V amounts to 4 kV, none of the fractions exceeds 3 kV, or in the general case 75% of the overvoltage V magnitude. This is the result of the three-to-four relationship between the lines, the equal capacitor values and the fact that the central circuit 310 represents a "floating island" from a voltage perspective.

According to one embodiment of the invention, the central circuit 310 contains a communication interface 315 arranged to exchange data and/or commands EXT with a remote server. Here, the communication interface is implemented as a wireless communication interface 315, for example a radio interface according the Bluetooth, BLE (Bluetooth Low Energy) and/or the IEEE 802.11 (or so-called WiFi) standard.

Preferably, to obtain convenient supply of power to the central circuit 310, the central circuit 310 is provided a power supply 351, e.g. in the form of an AC/DC converter. The power supply 351, in turn, is connected between one of the incoming phase lines, say $L_{1IN}$ and the incoming zero line $N_{IN}$. To prevent surges and similar kinds of overvoltages from damaging the AC/DC converter, this power connection is made via an overvoltage-protection circuit 350. The overvoltage-protection circuit 350 may for example include an avalanche/Zener diode, a gas-filled/discharge tube, a metal oxide varistor, a transient-voltage-suppression diode and/or a thyrsitor-surge-protection device.

According to one embodiment of the invention, an overvoltage-protection circuit 350 is connected between two of the incoming lines, here exemplified by the phase line $L_{1IN}$ and the zero line $N_{IN}$, and a power supply 351 to the central circuit 310. The power supply 351 contains an AC/DC unit providing the central circuit 310 with suitable direct-current power. The overvoltage-protection circuit is configured to protect the power supply 351 from any overvoltages in the phase line $L_{1IN}$ or the zero line $N_{IN}$.

Figure 5:
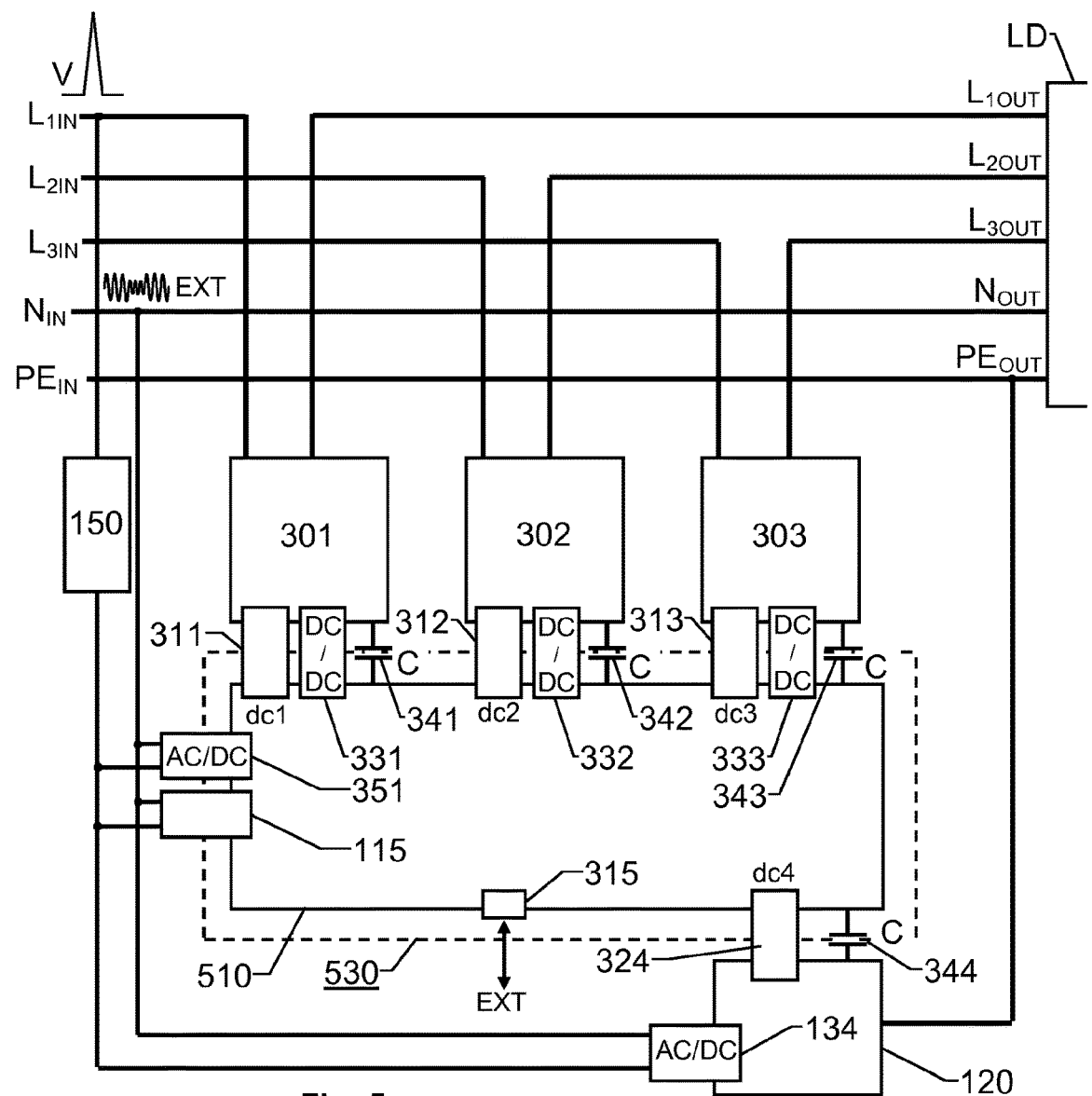
FIG. 5 shows a block diagram over a control device according to a third embodiment of the invention.

FIG. 5 shows a block diagram over a control device for handling the transfer of electric power from an electric power source to an electric load LD according to a third embodiment of the invention. Here, all reference numbers, which also occur in FIG. 1 or 3, designate the same components and entities as those, described above with reference to FIGS. 1 and 3 respectively.

In FIG. 5, the control device contains line circuits 301, 302, 303 and 120 respectively and a central circuit 510. The electric power is supplied in the form of alternating current via five incoming lines, namely $L_{1IN}$, $L_{2IN}$, $L_{3IN}$, $N_{IN}$ and $PE_{IN}$, and is delivered to the load LD in the form of alternating current via five outgoing lines $L_{1OUT}$, $L_{2OUT}$, $L_{3OUT}$, $N_{OUT}$ and $PE_{OUT}$. Analogous to the second embodiment shown in FIG. 3, the electric power is supplied in the form of alternating current in three separate phases, e.g. at 50 Hz with each 230 V phase voltage to earth, i.e. with 400 V between any two of the phase lines.

The central circuit 510 is configured to exchange data and/or commands dc1, dc2, dc3 and dc4 with the line circuits 301, 302, 303 and 320 over a respective galvanically isolated communication interface 311, 312, 313 and 324.

Figure 6:
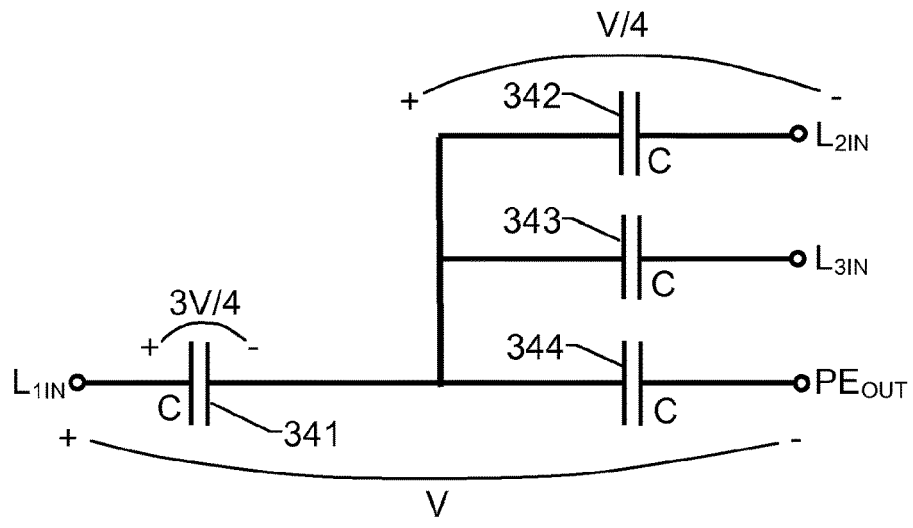
FIG. 6 illustrates schematically how the voltage of an incoming spike is divided between the four surge protection capacitors in the design of FIG. 5.

As a result, a reference potential of the central circuit 510 becomes floating relative to an earth potential of the incoming and outgoing lines, i.e. the central circuit 510 is a "floating island" 530 from a voltage point-of-view. A respective surge protection capacitor 341, 342, 343 and 344 is arranged in parallel with each of the galvanically isolated communication interfaces 311, 312, 313 and 324. The surge protection capacitors 341, 342, 343 and 344 are configured to accumulate a respective fraction of an electric charge resulting from an undesired overvoltage V on one of the incoming lines, say $L_{1IN}$, so as to split up the undesired overvoltage V into voltage fractions 3V/4 and V/4 over the galvanically isolated communication interfaces as illustrated in FIG. 6. This presumes that all the surge protection capacitors 341, 342, 343 and 344 have the same value C, which is preferable if the risk of voltage spikes is estimated to be essentially the same on all the lines $L_{1IN}$, $L_{2IN}$, $L_{3IN}$, $N_{IN}$, $PE_{IN}$, $L_{1OUT}$, $L_{20uT}$, $L_{3OUT}$, $N_{OUT}$ and $PE_{OUT}$.

Analogous to the second embodiment described above with reference to FIGS. 3 and 4, each of the voltage fractions 3V/4 and V/4 is smaller than the undesired overvoltage V. Consequently, the voltage-breakdown requirements on the galvanically isolated communication interfaces can be mitigated by 25%.

In further analogy to the first embodiment described above with reference to FIG. 1, an overvoltage-protection circuit 150 may connected between one of the incoming lines $L_{IN}$ and a power supply 351 to the central circuit 110. Here, such the overvoltage-protection circuit 150 is also connected to a power supply 134 to the line circuit 120. Each of said power supplies 351 and 134 implements an AC/DC unit configured to provide the central circuit 110 and the line circuit 120 respectively with appropriate direct-current power. The overvoltage-protection circuit 150 is configured to protect both the power supplies 351 and 134 from any overvoltages in the incoming line $L_{IN}$.

The term "comprises/comprising" when used in this specification is taken to specify the presence of stated features, integers, steps or components. However, the term does not preclude the presence or addition of one or more additional features, integers, steps or components or groups thereof.

The invention is not restricted to the described embodiments in the figures, but may be varied freely within the scope of the claims.

The invention claimed is:

1. A control device for handling the transfer of electric power from an electric power source to an electric load, electric power being supplied in the form of alternating current via at least two incoming lines and being delivered via at least two outgoing lines, the control device comprising:
   at least one line circuit configured to manage at least one parameter of the electric power being transferred via a particular one of said at least two outgoing lines,
   a central circuit configured to exchange data and/or commands with the at least one line circuit over a respective galvanically isolated communication interface rendering a reference potential of the central circuit floating relative to an earth potential of the at least two incoming and outgoing lines,
   a respective surge protection capacitor is arranged in parallel with each of said galvanically isolated communication interfaces, said surge protection capacitors being configured to accumulate a respective fraction of an electric charge resulting from an undesired overvoltage on one of said incoming lines so as to split up the undesired overvoltage into two or more voltages over said galvanically isolated communication interfaces each of which voltage is smaller than the undesired overvoltage.

2. The control device according to claim 1, wherein the surge protection capacitors all have the same value.

3. The control device according to claim 1, wherein each of the surge protection capacitors is communicatively separated from the respective galvanically isolated communication interface in parallel with which it is arranged.

4. The control device according to claim 1, wherein one of the at least one line circuit is a charge control circuit configured to manage charging of at least one battery comprised in the load.

5. The control device according to claim 4, wherein the charge control circuit is connected to a protected earth voltage line associated with the at least two incoming and outgoing lines.

6. The control device according to claim 5, wherein the central circuit is implemented in accordance with the extra-low voltage directive of the European Union.

7. The control device according to claim 4, wherein the central circuit comprises a communication interface arranged to exchange data and/or commands with a remote server.

8. The control device according to claim 7, wherein the communication interface is implemented as a power line communication interface configured to exchange the data and/or commands with the remote server via a subset of the at least two incoming lines.

9. The control device according to claim 7, wherein the communication interface is implemented as a wireless communication interface.

10. The control device according to claim 1, further comprising an overvoltage-protection circuit connected between at least one of the incoming lines and a power supply to the central circuit, which overvoltage-protection circuit is configured to protect the power supply from any overvoltages in said at least one line.

* * * * *